US011990399B2

(12) United States Patent
Armstrong

(10) Patent No.: US 11,990,399 B2
(45) Date of Patent: May 21, 2024

(54) DEVICE WITH DUMMY METALLIC TRACES

(71) Applicant: TEXAS INSTRUMENTS INCORPORATED, Dallas, TX (US)

(72) Inventor: Frank Armstrong, Terrell, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/834,837

(22) Filed: Jun. 7, 2022

(65) Prior Publication Data

US 2023/0102345 A1 Mar. 30, 2023

Related U.S. Application Data

(60) Provisional application No. 63/248,278, filed on Sep. 24, 2021.

(51) Int. Cl.
*H01L 23/498* (2006.01)
*H01L 21/48* (2006.01)
*H01L 23/15* (2006.01)

(52) U.S. Cl.
CPC .... *H01L 23/49838* (2013.01); *H01L 21/4807* (2013.01); *H01L 21/4867* (2013.01); *H01L 23/15* (2013.01)

(58) Field of Classification Search
CPC ........... H01L 23/49838; H01L 21/4807; H01L 21/4867; H01L 23/15; H05K 1/0306; H05K 3/10
USPC ........................................................ 257/668
See application file for complete search history.

(56) References Cited

U.S. PATENT DOCUMENTS

| | | | | | |
|---|---|---|---|---|---|
| 5,061,049 | A | * | 10/1991 | Hornbeck | G06K 15/1252 348/E5.142 |
| 7,755,176 | B1 | * | 7/2010 | St. Amand | H01L 24/83 257/730 |
| 2001/0010627 | A1 | * | 8/2001 | Akagawa | H01L 24/97 361/764 |
| 2005/0230835 | A1 | * | 10/2005 | Sunohara | H05K 1/185 257/E23.178 |
| 2006/0001179 | A1 | * | 1/2006 | Fukase | H01L 23/14 257/E23.008 |
| 2008/0042256 | A1 | * | 2/2008 | Hsieh | H05K 1/0271 257/E23.07 |
| 2012/0033395 | A1 | * | 2/2012 | Ishii | H05K 3/0097 29/829 |

(Continued)

FOREIGN PATENT DOCUMENTS

| | | | |
|---|---|---|---|
| JP | 2000216504 | * | 8/2000 |
| WO | WO2018030192 | * | 2/2018 |

OTHER PUBLICATIONS

Knack, K., et al., "The History and Use of Cross-Hatched Planes," Altium Industry Expert Series, Rigid Flex, Oct. 12, 2020, Updated Oct. 15, 2020, 4 pages.

*Primary Examiner* — Duy T Nguyen
(74) *Attorney, Agent, or Firm* — Michelle F. Murray; Frank D. Cimino

(57) ABSTRACT

An electronic device includes a substrate having a surface, functional metallic traces on a first portion of the surface that are electrically connected to carry current in the electronic device and have a first density, and dummy metallic traces on a second portion of the surface that are electrically isolated from the functional metallic traces and have a second density that is within at least 50% of the first density.

20 Claims, 7 Drawing Sheets

(56) References Cited

U.S. PATENT DOCUMENTS

2015/0245473 A1* 8/2015 Shimizu ................. H05K 1/113
    29/850
2015/0357276 A1* 12/2015 Shimizu ............ H01L 23/49827
    361/783

* cited by examiner

DEVICE WITH DUMMY METALLIC TRACES

CROSS-REFERENCE TO RELATED APPLICATIONS

The present application claims priority to U.S. Provisional Patent Application No. 63/248,278, which was filed Sep. 24, 2021, is titled "Method For Creating Planar Surfaces On Routed Ceramic Substrates And PCBS," and is hereby incorporated herein by reference in its entirety.

BACKGROUND

Ceramic substrates are types of substrates useful for integrated circuits in electronic devices. A ceramic substrate is a processed electrical device carrier where a conductive material, such as copper or tungsten, is bonded to the surface of a ceramic substrate, such as an alumina or aluminum nitride substrate, at a certain high temperature. Compared with other material, ceramic substrates can be thin, provide high electrical insulation, high strength and stiffness, and high thermal conductivity, and have soft solderability and high adhesion strength. Ceramic substrates are suitable for electronic devices with high heat generation, such as high-brightness lamp or light emitting devices (LEDs), laser phosphor, laser-based projection devices, and solar cells, and are also useful in weather resistance devices for outdoor environments.

SUMMARY

In accordance with at least one example of the disclosure, an electronic device includes a substrate having a surface, functional metallic traces on a first portion of the surface that are electrically connected to carry current in the electronic device and have a first density, and dummy metallic traces on a second portion of the surface that are electrically isolated from the functional metallic traces and have a second density that is within at least 50% of the first density.

In accordance with at least one example of the disclosure, a method includes forming patterns of metallic traces on ceramic sheets, printing metal according to the patterns on the ceramic sheets to form the metallic traces including functional metallic traces and dummy metallic traces, forming vias through the ceramic sheets, and stacking and aligning the ceramic sheets to form a ceramic substrate.

In accordance with at least one example of the disclosure, a device includes a ceramic substrate having a surface, functional metallic traces on a first portion of the surface that are electrically connected to carry current in the device and have a first density, dummy metallic traces on a second portion of the surface that are electrically isolated from the functional metallic traces and have a second density that is within at least 50% of the first density, and a die attached to the surface and that is electrically connected to the functional metallic traces and electrically isolated from the dummy metallic traces.

DETAILED DESCRIPTION

Figure 1:
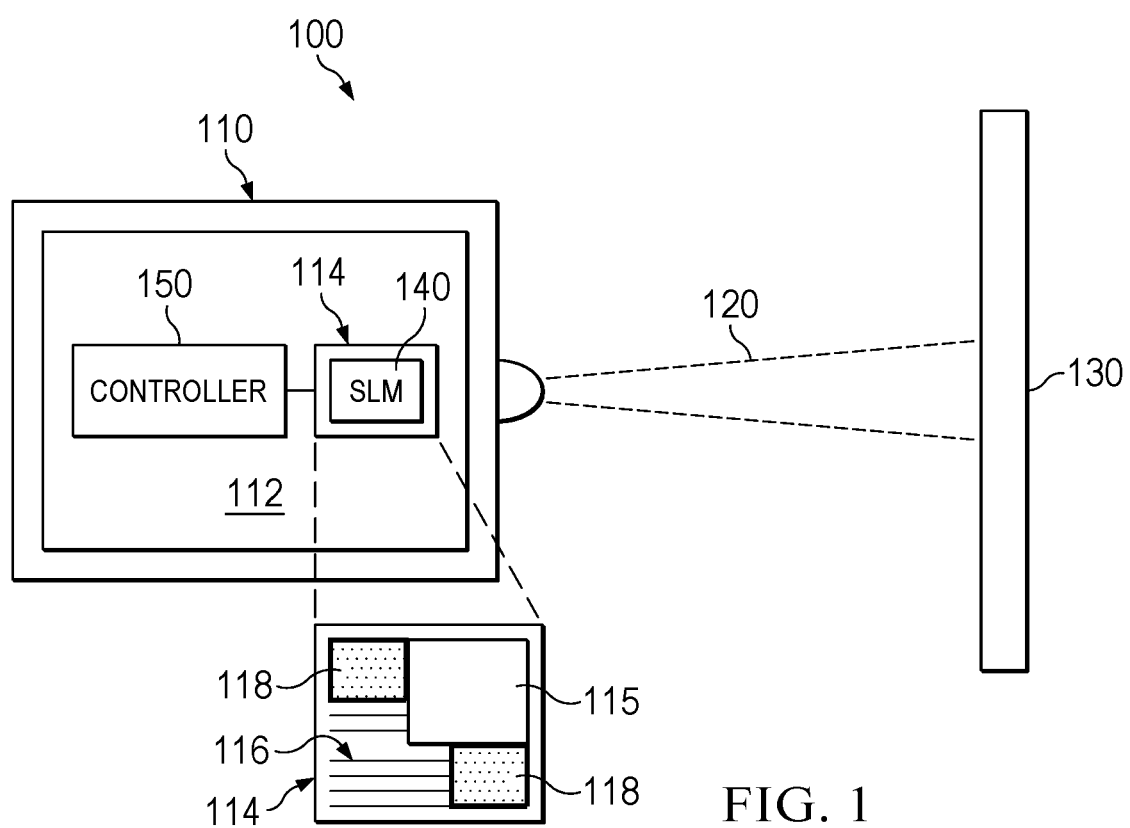
FIG. 1 is a diagram of a display system, in accordance with various examples.

In integrated circuits, circuit traces can be routed onto layers within ceramic substrates that provide electrical insulation, heat dissipation, and structural support. The layers which include routed metallic traces are also referred to herein as routing layers. Dies, which are silicon chips containing electrical circuits and electronic components, can be attached onto ceramic substrates by epoxy or solder materials. A circuit device can include one or more layers of ceramic substrates, which may be stacked on top of each other. Ceramic substrates can also be attached to circuit boards, also referred to herein as PCBs.

Ceramic substrates are examples of substrates that are useful for electronic devices because of the strength and heat dissipation properties of ceramic materials. For example, ceramic substrates are useful for electronic devices with relatively high heat generation compared to other electronic devices, such as high intensity lamps or light emitting diodes (LEDs), laser phosphor and/or direct laser-based projection devices, and photovoltaic cells. Circuit boards that include ceramic substrates are useful in electronic devices with high heat dissipation requirements in comparison to other devices. Examples of devices with ceramic substrates include display devices, such as a spatial light modulator (SLM) displays. SLM displays may include micro-electro-mechanical systems (MEMS) based display devices such as digital micromirror devices (DMDs) that include adjustable tilting micromirrors for projecting images or video for display. Other examples SLM displays include liquid crystal on silicon (LCoS) devices and liquid crystal displays (LCDs). Such displays can also include devices with ceramic substrates. Examples of MEMS devices with ceramic substrates also include MEMS sensor devices such as for gas sensors and radio frequency (RF) MEMS devices such as for RF and microwave transceivers. Each micromirror projects a pixel of the image to be displayed. The micromirrors are tilted by applying voltages to the micromirrors to project dark, bright, or shades of light per pixel. A DMD projection-based display system can also include light sources, such as laser light sources, of different wavelengths that provide color modes of the image. The light sources are operated to project color modes of light on the DMD to form the image. Other examples of devices with ceramic substrates include cooling and heating devices, power control devices, automotive electronics, aerospace and military electronic components, solar panel components, telecommunications switches, and lasers.

A ceramic substrate can be a mixture of ceramic and binder materials. Examples of ceramic materials include (but are not limited to) alumina ($Al_2O_3$), aluminum nitride (AlN), beryllium oxide (BeO), and silicon carbide (SiC). Examples of binder materials include (but are not limited to) epoxy and glass materials, organic binders such as butyl resin or acrylic acid ester, water soluble polyvinyl acetals and/or acrylic acid esters, and other binding agents. Circuit traces of conductive materials, such as copper or tungsten, can be routed on ceramic substrates for carrying electric current. The circuit traces can be formed by metal patterning processes of integrated circuit manufacturing, such as for PCBs. Metal patterning processes can include a combination of metal deposition, metal removal, and photolithography. For example, a resist layer is first patterned, such as by a photolithography process, on top of a metal layer on the substrate. The exposed metal under the patterned resist layer is then etched with a chemical etching process. The patterned resist layer is then removed by a chemical solution, which provides a remaining patterned metal layer on the surface. In another metal patterning process, the metal is deposited over a patterned resist layer. The resist layer under the metal is then removed, such as by lift off chemical process, to provide a patterned metal layer. In other examples, circuit traces can be formed by a screen printing process of a conductive material on the surface of a ceramic substrate. The conductive material, which can be in liquid or paste form laden with conductive copper or tungsten particles, is transferred through a patterned screen to the surface of the ceramic substrate. During a stage of ceramic substrate processing, the substrate is then heated, in a heating process, to evaporate the liquid, leaving the conductive material as a conductor in the form of circuit traces on the surfaces of the layers that form the substrate. The circuit traces of conductive materials are also referred to herein as metallic traces.

Manufacturing processes for packaging electrical circuits with one or more ceramic substrates include multiple steps. For example, the steps include a tape casting step for producing ceramic sheets as a mixture of ceramic and binder materials. The ceramic sheets can be cut, such as into rectangular or square shaped sheets, for further processing. The steps include punching holes into one or more of the ceramic sheets to provide cavities and/or vias through the ceramic sheets. The steps also include forming and routing metallic traces, by circuit patterning processes, on the surfaces of the ceramic sheets. Examples of conductive materials that are useful for metallic traces on ceramic substrates include copper and tungsten. The vias in the ceramic sheets can be filled or plated with the same conductive material as the metallic traces to provide electrical interconnections between the one or more layers of the ceramic substrates. Multiple ceramic sheets can be properly aligned and stacked on top of each other. The consistency and surface energy of the layer material causes the layers to adhere to each other, such as by mechanical pressing. In other examples, the stacked ceramic sheets can be laminated, which is a process by which the stacked ceramic sheets are bonded together by a bonding material. The steps also include dividing and shaping the stacked and bonded layers of ceramic sheets into separate ceramic substrates, each composed of multiple layers of ceramic sheets with routed metallic traces. The ceramic substrates can be cofired, which is a process by which the ceramic substrates are exposed to a certain temperature, and plated with metal, such as nickel, gold, and/or palladium to prevent any exposed metallic traces from corrosion. Dies can then be attached, by epoxy materials, on the surfaces of the ceramic substrates or in cavities that form sockets in the ceramic substrates. The epoxy attaching the ceramic substrates with the die can be cured by thermal or ultraviolet light energy to bind the components together.

The steps for printing and packaging electrical circuits with ceramic substrates may cause non-planar surfaces in one or more layers of the ceramic substrates. For example, the distribution of the routed metallic traces can provide areas that are empty of metallic traces or that include a lower density of metallic traces in the layers. The density of metallic traces in an area of the surface or layer represents the ratio of the parts of the area which are filled with metallic traces to the gap parts or the parts that are not filled with metallic traces. The ratio can depend on the line width and spacing of the metallic traces. The lack of metallic traces or the reduced metallic density in some areas can cause surface variations in the layers, creating non-planar surfaces in the ceramic substrate or a stack of layers within the ceramic substrates. For example, a stack of layers within a ceramic substrate can include raised surfaces above areas where the density of metallic traces is relatively higher with respect to surrounding surfaces. Surfaces above or below areas where the routing of metallic traces is relatively sparse or nonexistent can also appear depressed with respect to surrounding surfaces.

The non-planar surfaces can cause stress areas in the epoxy which is useful to attach dies to the ceramic substrates. This stress may be transferred to the die and other components attached to the substrate. For example, the stress on the die can be caused by epoxy shrinkage during curing and substrate shaping steps of the manufacturing process. Because ceramic substrate materials can be structurally stronger than die materials, the stress can cause a die that is attached to a ceramic substrate to conform to the shape of the ceramic substrate, which can damage the die. The stress on the die can increase if the size of the die increases, if the thickness of the epoxy under the die increases, or if the die bonding process is more brittle.

This description includes various examples of providing planar surfaces or reducing non-planar surfaces in ceramic substrates that include one or more layers of conductive and/or insulating materials. To provide the planar surfaces or reduce the non-planar surfaces, dummy metallic traces are routed on the layers within a ceramic substrate, which also includes functional metallic traces that are routed to provide electrical connections according to the design of the electrical circuit. The current carrying metallic traces that are routed to provide electrical connections are also referred to herein as functional metallic traces. The metallic traces that are routed to provide planar surfaces or reduce non-planar surfaces are also referred to herein as dummy metallic traces. The dummy metallic traces are routed with the current carrying metallic traces to increase the density of metallic traces, provide a more uniform density of the metallic traces or materials on one or more layers, and/or reduce gaps across the surface of layers within the ceramic substrate. The uniform density of the metallic traces represents the similarity of the metallic density across the surface. The routed dummy metallic traces can provide uniform density of metallic traces in one or more separate areas, such as in gap areas on the surface, or across the entire surface. The dummy metallic traces may be equally spaced in the one or more separate areas to provide this uniform density. The line width of the metallic traces that form the dummy metallic traces can also determine the density of the dummy metallic traces. The line width and spacing of the dummy metallic traces in an area on the surface determine a ratio of an area portion that is filled with the dummy metallic traces to a gap portion that is not filled, and accordingly the metallic density in this area. Routing the dummy metallic traces with the functional metallic traces on the surfaces of the layers also reduces variation of density of metallic traces and variation of layer thickness across the surfaces. The dummy metallic traces can be routed with the current carrying metallic traces in each layer where there is a gap or reduced density of metallic traces or other materials across the surface. Accordingly, the dummy metallic traces can reduce non-planar surfaces or increase surface flatness across the layers of ceramic substrates. The density of metallic traces in a layer is also referred to herein as metallic density.

The density of the dummy metallic traces is determined based on the density of the functional metallic traces around or in a same area of the dummy metallic traces on the surface of the layer. In examples, the density of the dummy metallic traces is matched, such as by a percentage, to the density of the functional metallic traces around or in the same area of the dummy metallic traces. In this case, different areas of the surface can have different average densities of dummy and functional metallic traces. For example, the density of the dummy metallic traces can be within at least 50 percent (%) of the density of the functional metallic traces. In this case, the density of the dummy metallic traces is at least half of the density of the functional metallic traces on the surface. In other examples, the average density of metallic traces is matched across the entire surface. To match the average metallic density across the entire surface, the density of functional traces in the filled areas on the surface is determined. Accordingly, dummy metallic traces are routed in the gap areas to provide an average density across the surface based on the density of the functional metallic traces in the filled areas. In a stack of layers within a ceramic substrate, the average density can be matched based on the density of the functional metallic traces on a layer by layer basis.

For example, in a stack of layers within a ceramic substrate, if the density of the functional metallic traces in a first layer of the ceramic substrate is lower than the densities of other layers, the density of routed dummy metallic traces in the first layer matches this lower density and may also be lower than the density of dummy metallic traces in other layers. If the density of the functional metallic traces in a second layer of the ceramic substrate is higher than the densities of other layers, the density of routed dummy metallic traces in the second layer matches this higher density and may also be higher than the density of dummy metallic traces in other layers. The line spacing of metallic traces in the first layer that has relatively lower metallic density may also be larger than the line spacing of the metallic traces in the second layer with the relatively higher metallic density. Dummy metallic traces can also be routed with functional metallic traces in the same area in a layer. For example, dummy metallic traces can be routed in spaces between functional metallic traces in the same area if the density of the functional metallic traces in this area is less than the metallic density in other areas in the same layer. The dummy metallic traces are routed with the functional metallic traces to increase the average metallic density in the area or to match the average metallic density of the other filled areas.

The average metallic density can vary for different devices and circuit designs. For example, extended graphic array (XGA) or wide XGA (WXGA) devices with single data rate (SDR) or double data rate (DDR) interfaces may have fewer functional metallic traces in comparison to other display devices with higher pixel resolution. In relatively lower pixel resolution display devices, fewer dummy metallic traces can be routed to fill relatively larger gap areas and provide a relatively lower average metallic density, in comparison to other higher pixel resolution display devices. Display devices with higher pixel resolution, such as 4K or 8K display devices with high speed serial interfaces (HSSIs) may have more functional metallic traces than lower pixel resolution display devices. Accordingly, more dummy metallic traces can be routed in higher pixel resolution display devices to fill relatively smaller gap areas and provide a relatively higher average metallic density, in comparison to lower pixel resolution display devices.

The dummy metallic traces are not for carrying current and accordingly are not grounded and not connected to the current carrying metallic traces, electronic components, or vias. The routing of the dummy metallic traces in the layers may depend on the locations of the vias. For example, to avoid contact with the vias, the dummy metallic traces are excluded from areas where the vias extend through the layers. The dummy metallic traces routed outside the areas where the vias are located may be separated from the vias by distances which mitigate or avoid electrical interreference with current that may be carried in the vias. The locations of the vias may be based on the circuit design, and subsequently the routing of the dummy metallic traces is determined to excluded the locations of the vias. In other examples, the dummy metallic traces can be connected to a ground plane through direct contact with vias, which can extend through one or more layers, such as to reduce noise or reduce ground loops of functional metallic traces.

The dummy metallic traces can be routed in a pattern or a combination of patterns, such as in the shape of cross-hatched traces, line traces, square patches, diamond patches, rectangle patches, or other shapes that can be formed by the manufacturing process. The dummy metallic traces can also be formed of the same conductive material and with the same steps of printing as the current carrying metallic traces. In other examples, the dummy metallic traces can be formed of one or more other conductive or non-conductive materials and by one or more other processes.

The examples herein describe routing the dummy metallic traces with functional metallic traces in one or more layers on ceramic substrates. In other examples, the dummy metallic traces can also be routed with functional metallic traces in one or more layers on other types of substrates. For example, the dummy metallic traces can be routed with functional metallic traces in one or more layers in PCBs with substrates made of a dielectric or non-conductive materials, such as a combination of glass and epoxy. Examples of PCB substrates include flame retardant (FR type) substrates, composite epoxy materials (CEM) substrates, high-pressure fiberglass laminate (G type) substrates, aluminum or insulated metal (IMS) substrates, polytetrafluoroethylene (PTFE) substrates, polyimide substrates, and organic substrates. In examples, the dummy metallic traces can be routed with functional metallic traces in one or more layer in SiCBs with silicon substrates. Routing the dummy metallic traces in one or more layers in a stack of layers on such substrates can increase overall flatness across the layers.

FIG. 1 is a block diagram of a display system 100 including a display device 110 with a circuit board 112, in accordance with various examples. The circuit board 112 includes a ceramic substrate 114 with one or more layers of conductive and/or insulating materials that form planar surfaces. The ceramic substrate 114 is useful for heat dissipation in the display device 110. The display device 110 may also include a die 115 (e.g., chip) mounted onto the ceramic substrate 114. The materials include functional or current carrying metallic traces 116 on the surface of one or more layers of the ceramic substrate 114. The one or more layers also include dummy metallic traces 118. The dummy metallic traces are traces that are routed in the same layers with the functional metallic traces to provide planar surfaces on the substrate, which reduces stress and accordingly defect or damage to the die 115.

The display system 100 may be a projection-based display system for projecting images or video. The display system 100 includes a projection-based display device 110 configured to project a modulated light beam 120 onto an image projection surface 130. Examples of the image projection surface 130 include a wall or a display screen. For example, the display screen may be a screen of an augmented reality (AR) or virtual reality (VR) display, a three-dimensional (3D) display, the ground or road for a headlight display, a projection surface in a vehicle such as for a windshield projection display, or other display surfaces for display devices. The modulated light beam 120 may be modulated by the display device 110 to project still images or moving images, such as video, onto the image projection surface 130. The modulated light beam 120 may be formed as a combination of light beams corresponding to multiple color modes provided by the display device 110. The display device 110 may include light sources (not shown) for providing the light beams at different wavelengths. The light beams at different wavelengths provide respective color components of the image and can be spatially modulated to form the image on the image projection surface 130. The display device 110 may include an SLM 140 mounted to the ceramic substrate 114 and having optical components (not shown) for modulating the light beams from the light sources to provide the images or video on the image projection surface 130.

The SLM 140 includes the die 115 attached onto the ceramic substrate 114 that is coupled to the circuit board 112. The ceramic substrate 114 has a planar surface including both the functional metallic traces 116 and the dummy metallic traces 118. The display device 110 may also include a controller 150 coupled to the SLM 140 for controlling the components of the display device 110 to display the images or video. The SLM 140 and the controller 150 can be integrated on the circuit board 112, which may be a PCB. For example, the SLM 140 and the controller 150 may be system on chips (SoCs) embedded on the circuit board 112. In other examples, the SLM 140 and the controller 150 may be embedded on separate circuit boards. In other examples, the controller 150 or other chips (not shown) may also be attached to one or more ceramic substrates 114 and coupled to the circuit board 112.

Figure 2:
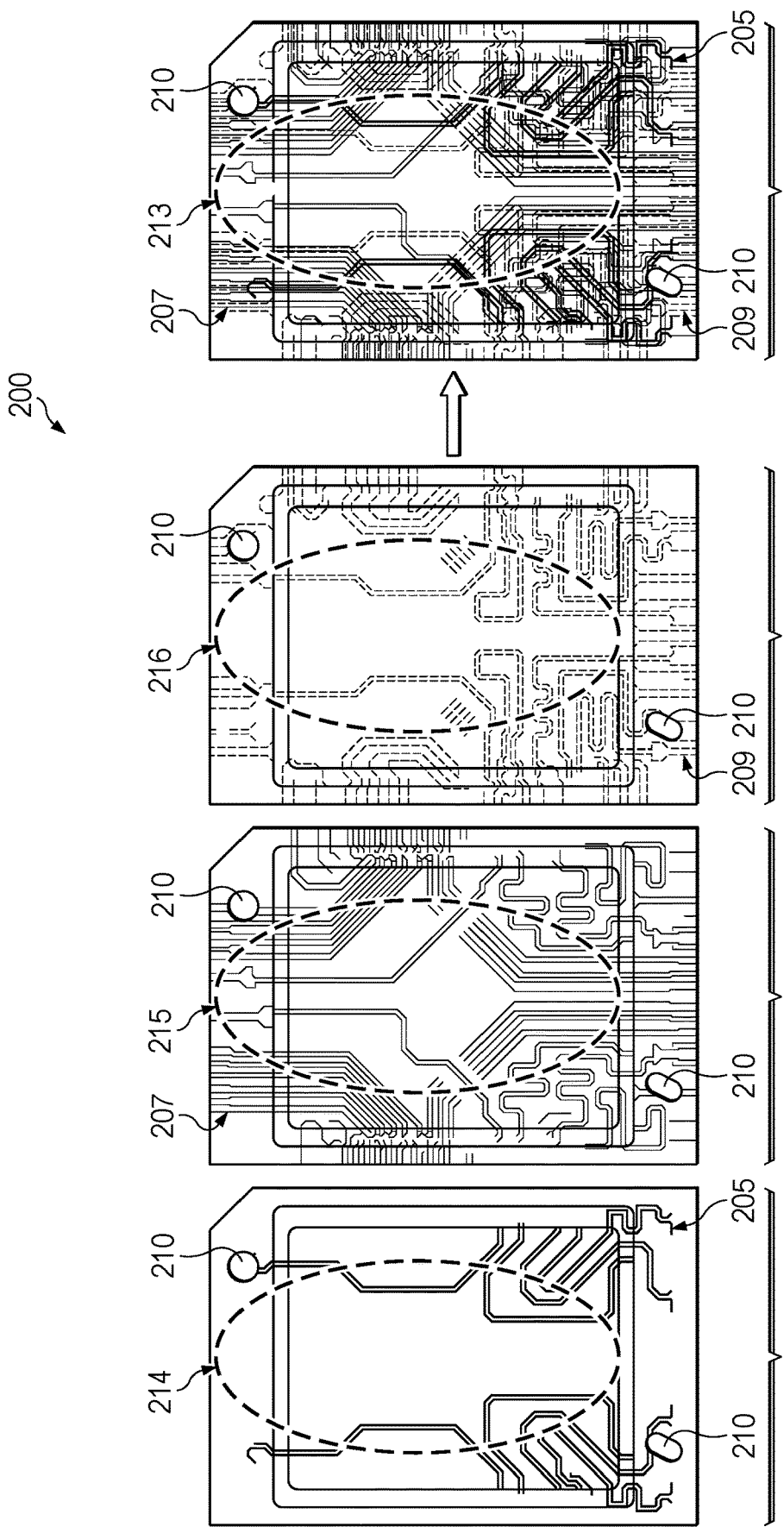
FIG. 2 is a diagram showing a stack of routing layers within a ceramic substrate, in accordance with various examples.

FIG. 2 shows a stack of routing layers 200 within a ceramic substrate 201 without dummy metallic traces, in accordance with various examples. For example, the stack of routing layers 200 of the ceramic substrate 201 can be part of an integrated circuit or an electronic device. The routing layers 200 are described as an example of the relationship between the variations in the density of metallic traces or other materials across the routing layers 200 and the variations in the surfaces within the stack of routing layers 200 in the ceramic substrate 201. The routing layers 200 can be ceramic sheets and include routed metallic traces. The routing layers 200 include a first routing layer 202, a second routing layer 203, and a third routing layer 204. In other examples, there may be in the stack of routing layers 200 as few as one routing layer or as many routing layers as necessary to accommodate all the routed metallic traces required by the circuit design. The first routing layer 202, second routing layer 203, and third routing layer 204 are shown separately on the left side of FIG. 2. In examples, the first routing layer 202 includes first functional metallic traces 205, the second routing layer 203 includes second functional metallic traces 207, and the third routing layer 204 includes third functional metallic traces 209. The first routing layer 202, second routing layer 203, and third routing layer 204 also include vias 210 that interconnect one routing layer to another. The first, second, and third functional metallic traces 205, 207, and 209 form one or more electrical circuits within the ceramic substrate 201. For example, the first, second, and third functional metallic traces 205, 207, and 209 are line traces of a conductive material for carrying current in the stack of routing layers 200 within the ceramic substrate 201 and can be connected to electronic components (not shown).

The first routing layer 202, second routing layer 203, and third routing layer 204 are stacked on top of each other to form the ceramic substrate 201, as shown on the right side of FIG. 2. The first routing layer 202, second routing layer 203, and third routing layer 204 are also aligned to extend the vias 210 through the ceramic substrate 201. The vias 210 may be filled with the same conductive material useful to print the conductive metallic traces and electrically coupled to the first, second, and third functional metallic traces 205, 207, and 209. For example, multiple vias 210 may provide either power, grounding, or discrete signals to the first, second, and third functional metallic traces 205, 207, and 209.

The stack of routing layers 200 also includes a combined area 213 of low metallic density with respect to the remaining areas through the first, second, and third routing layers 202, 203, and 204 combined. The combined area 213 of low metal density includes lower density areas of the first, second, and third functional metallic traces 205, 207, and 209 with respect to the remaining areas. The combined area 213 is an overlap between a first lower metal density area 214 with respect to the remaining areas in the first routing layer 202, a second lower metal density area 215 with respect to the remaining areas in the second routing layer 203, and a third lower metal density area 216 with respect to the remaining areas in the third routing layer 204. The first lower metal density area 214 includes a lower density of first functional metallic traces 205 with respect to the remaining areas of the first routing layer 202. The second lower metal density area 215 includes a lower density of second functional metallic traces 207 with respect to the remaining areas of the second routing layer 203. The third lower metal density area 216 includes a lower density of third functional metallic traces 209 with respect to the remaining areas of the third routing layer 204.

Figure 3:
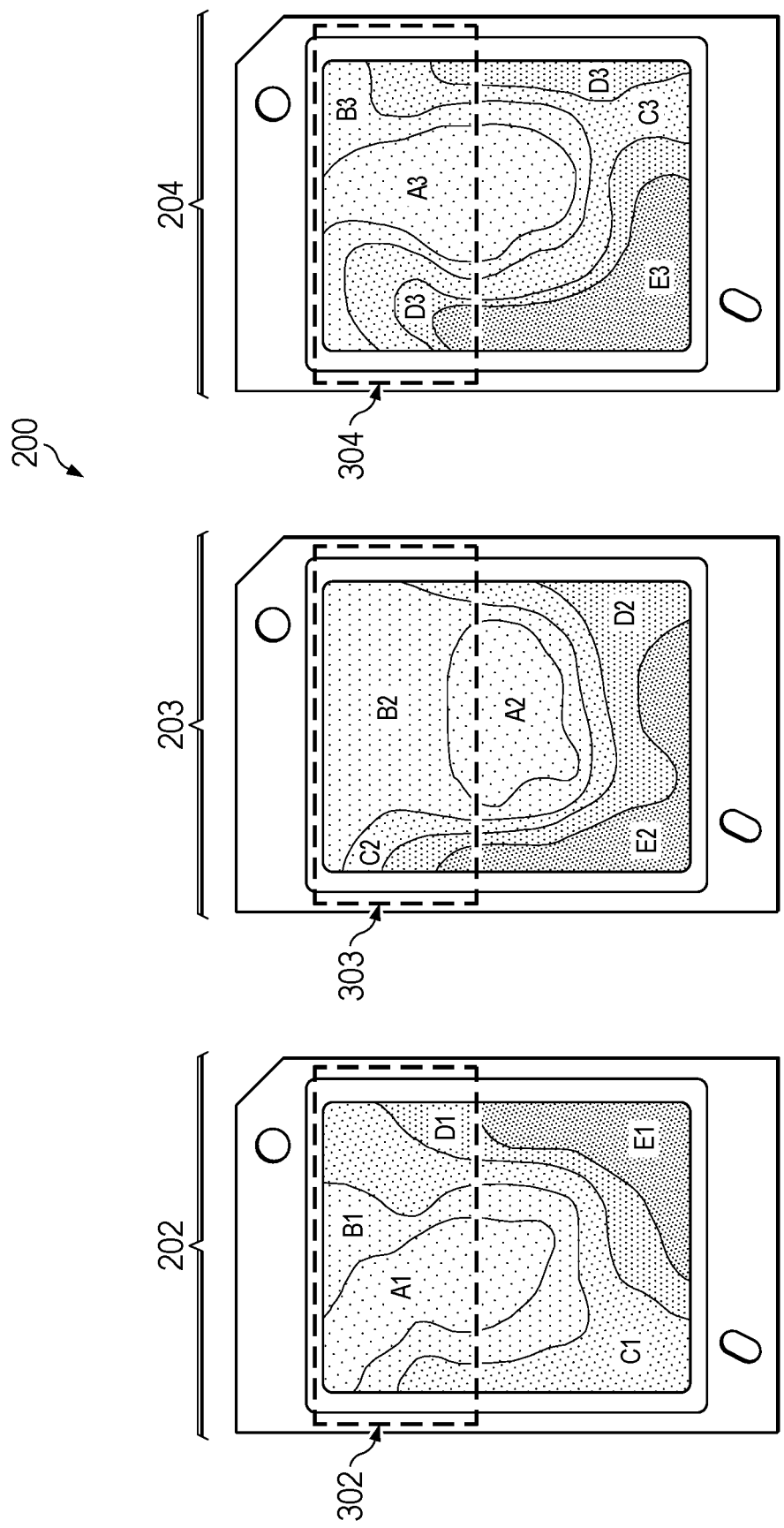
FIG. 3 is a diagram showing surface variations across the routing layers of the ceramic substrate of FIG. 2, in accordance with various examples.

FIG. 3 shows surface variations across the routing layers 200 of the ceramic substrate 201 without dummy metallic traces, in accordance with various examples. The surface variations shown in FIG. 3 across the routing layers 200 of the ceramic substrate 201 demonstrate the effect of gaps or of reduced variations of density of metallic traces or other materials on the flatness across the routing layers 200 that form the ceramic substrate 201. The surface variations are shown for each of the first routing layer 202, second routing layer 203, and third routing layer 204. As shown, the first routing layer 202 is sectioned into five sections of different layer thickness. The sections are labeled A1, B1, C1, D1, and E1 and have layer thicknesses that increase in that order. For example, section A1 has the lowest layer thickness and section E1 has the highest layer thickness. Similarly, the second routing layer 203 is sectioned into five sections of different layer thickness, which are labeled A2, B2, C2, D2, and E2 and have layer thicknesses that increase in that order. The third routing layer 204 is also sectioned into five sections of different layer thickness, which are labeled A3, B3, C3, D3, and E3 and have layer thicknesses that increase in that order.

For example, because of the lower metal density of the first lower metal density area 214 on the first routing layer 202, a surface area 302 of the first routing layer 202, which overlaps with portions of sections A1, B1, C1 and D1, can be depressed with respect to the remaining areas of the first routing layer 202. Because of the lower metal density of the second lower metal density area 215 on the second routing layer 203, a surface area 303 of the second routing layer 203, which primarily overlaps with portions of section B2, can be depressed with respect to the remaining areas of the second routing layer 203. Because of the lower metal density of the third lower metal density area 216 on the third routing layer 204, a surface area 304 of the third routing layer 204, which primarily overlaps with portions of sections A3, B3, C3, and D3, can be depressed with respect to the remaining areas of the third routing layer 204. Accordingly, the combined area 213 in FIG. 2 can also be a depressed area with respect to the remaining areas of the routing layers 200 that form the ceramic substrate 201. The differences between the layer thicknesses of the respective areas of the first routing layer 202, second routing layer 203, and third routing layer 204 can cause non-planar surfaces in the routing layers 200 and accordingly in the ceramic substrate 201.

Figure 4A:
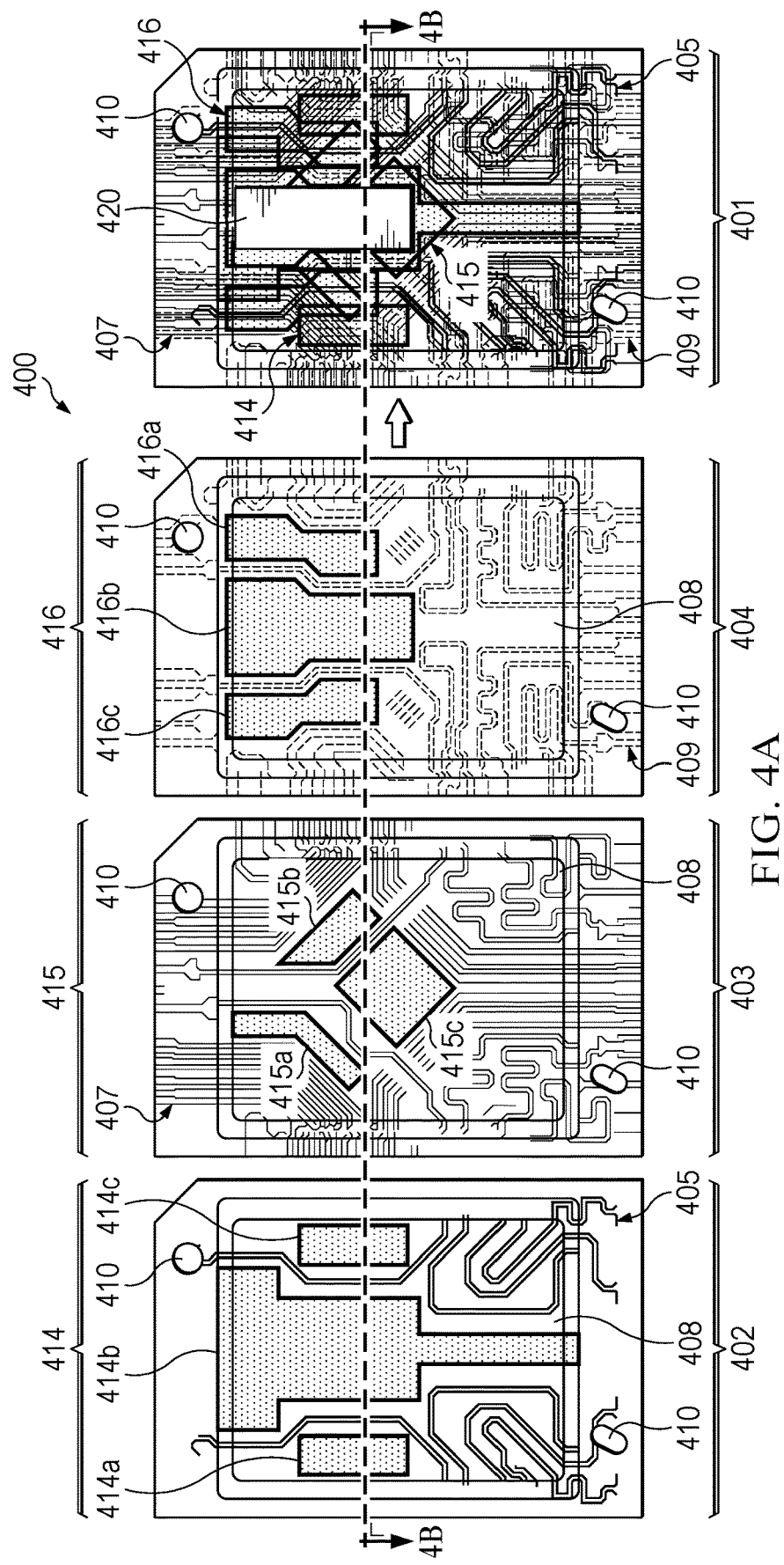
FIGS. 4A and 4B are a top view and a cross sectional view, respectively, of a diagram showing a stack of routing layers within a ceramic substrate with dummy metallic traces, in accordance with various examples.
Figure 4B:
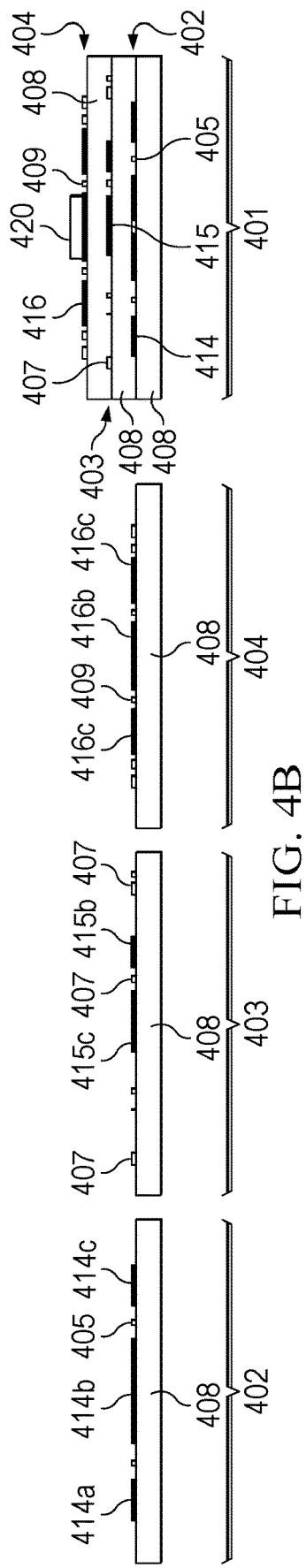

FIGS. 4A and 4B show a top view and a cross sectional view, respectively, of a stack of routing layers 400 within a ceramic substrate 401 with dummy metallic traces, in accordance with various examples. The routing layers 400 of the ceramic substrate 401 can be useful for integrated circuits or electronic devices with high heat dissipation and/or high strength or stiffness requirements such as display devices. For example, the ceramic substrate 401 may correspond to the ceramic substrate 114 in the display device 110. The routing layers 400 of the ceramic substrate 401 include a first routing layer 402, a second routing layer 403, and a third routing layer 404. In other examples, there may be in the stack of routing layers 400 as few as one routing layer or as many routing layers as necessary to accommodate all the routed metallic traces required by the circuit design. For example, the ceramic substrate 401 can include four or eight routing layers 400. The number of routing layers 400 can also reach tens of layers, such as up to approximately 100 layers. The first routing layer 402, second routing layer 403, and third routing layer 404 are shown separately on the left side of FIG. 4A. FIG. 4B shows cross sectional views for the ceramic substrate 401 and the first routing layer 402, second routing layer 403, and third routing layer 404. In examples, the first routing layer 402 includes first functional metallic traces 405, the second routing layer 403 includes second functional metallic traces 407, and the third routing layer 404 includes third functional metallic traces 409. The first, second, and third routing layers 402, 403, and 404 also include vias 410 that interconnect between the routing layers 400. The first, second, and third functional metallic traces 405, 407, and 409 form one or more electrical circuits within the stack of routing layers 400 that form the ceramic substrate 401. For example, the first, second, and third functional metallic traces 405, 407, and 409 are line traces of a conductive material for carrying current in the stack of routing layers 400 of the ceramic substrate 401 and can be connected to electronic components (not shown).

The first routing layer 402 also includes first dummy metallic traces 414 that are routed on the first routing layer 402 outside the areas of the first functional metallic traces 405. The first dummy metallic traces 414 can be routed in areas that do not include the first functional metallic traces 405. The first dummy metallic traces 414 can also be routed in areas that are sparsely routed with first functional metallic traces 405 or with other structures in comparison to areas with higher material density on the surface of the first routing layer 402. For example, the first dummy metallic traces 414 can include a first part 414a, a second part 414b, and a third part 414c, each of which may be separate parts of the first dummy metallic traces 414 that are routed in three respective separate areas on the surface of the first routing layer 402. The first dummy metallic traces 414 in the first, second, and third parts 414a, 414b, and 414c may have the same pattern. For example, the pattern of the first dummy metallic traces 414 may be cross-hatched traces, line traces, or metallic patches in each of the first, second, and third parts 414a, 414b, and 414c. In other examples, the first dummy metallic traces 414 in the first, second, and third parts 414a, 414b, and 414c may have different patterns. In other examples, the first dummy metallic traces 414 may be distributed in fewer or more than three parts on the surface of the first routing layer 402 according to the requirements of the routing design.

Other examples of patterns of the first dummy metallic traces 414 include lines, crossed lines, patches or grids of any geometry, such as in the shape of squares, rectangles, circles, triangles, or other shapes. The pattern of the first dummy metallic traces 414 can be similar or different to the pattern of the first functional metallic traces 405. For example, the first functional metallic traces 405 can be patterned as lines of metallic traces, and the first dummy metallic traces 414 can be patterned similarly as line traces, cross-hatched traces, or metallic patches.

The number of parts of the dummy metallic traces 414 can depend on the number of gap areas between the functional metallic traces 405. For example, the number of parts of the dummy metallic traces 414 can match the number of gap areas between the functional metallic traces 405. As shown in FIG. 4, the first, second, and third parts 414a, 414b, and 414c are routed in three respective gap areas between the functional metallic traces 405. In other examples, the number of parts of the dummy metallic traces 414 can match the number of areas that are filled with the functional metallic traces 405. The dummy metallic traces 414 can be routed around each area filled with functional metallic traces 405.

In examples, the densities of the first dummy metallic traces 414 in the first, second, and third parts 414a, 414b, and 414c may be different. The densities of the first dummy metallic traces 414 in the first, second, and third parts 414a, 414b, and 414c depend on and match the densities of the first functional metallic traces 405 around the first, second, and third parts 414a, 414b, and 414c, respectively. Accordingly, if the density of the first functional metallic traces 405 are different in respective areas around the first, second, and third parts 414a, 414b, and 414c, the densities of the first dummy metallic traces 414 around the respective areas are also different. For example, if a first area around the first part 414a has a higher density of first functional metallic traces 405 than a second area around the third part 414c, the matching density of the first dummy metallic traces 414 is also higher in the first part 414a relative to the third part 414c. The line width and spacing of the first dummy traces 414 in the areas on the surface determine the density of the first dummy metallic traces 414. For example, if the first dummy metallic traces are line traces or cross-hatched traces, the line width and spacing determine the ratio of metallic traces to gaps, and accordingly the metallic density, in the areas.

In other examples, the average densities of the first functional metallic traces 405 and the first dummy metallic traces 414 are similar across the entire surface of the first routing layer 402, including the respective areas around the first, second, and third parts 414a, 414b, and 414c. In this case, the densities of the first dummy metallic traces 414 in the first, second, and third parts 414a, 414b, and 414c may be determined according to the respective densities of the first functional metallic traces 405 around the respective areas to provide an average density of metallic traces across the entire surface of the first routing layer 402.

The first dummy metallic traces 414 are provided, with the first functional metallic traces 405, on the surface of the first routing layer 402 to provide a more uniform density and distribution of the metallic traces or of materials on the surface, increase the density of metallic traces, and/or reduce gaps across the surface of the first routing layer 402. To provide this uniform density of metallic traces, the first dummy metallic traces 414 are equally spaced in the respective areas of the first, second, and third parts 414a, 414b, and 414c. The first dummy metallic traces 414 can also have equal line width. For example, the first dummy metallic traces 414 are comprised of line traces or crossing line traces (e.g., cross-hatched traces) which are metal lines of approximately the same width that are formed by the same fabrication process. The height (thickness) of the first dummy metallic traces 414 is also equal to the height of the first functional metallic traces 405 on the surface of the first routing layer 402. For example, the first dummy metallic traces 414 and the first functional metallic traces 405 include metal lines of approximately the same height that are formed by the same fabrication process. The variations between the approximately equal width and spacing of the metal lines may be based on the limitations and uncertainties in the fabrication process. For example, the approximately equal width or spacing can vary to up to 10% or 15% between the metal lines. A threshold of the variation in the width or spacing of the metal lines by the fabrication process can be tolerated according to quality requirements of manufacturing and device design. The line width and spacing of the first dummy metallic traces 414 may be equal or different in the different areas. This also reduces variation of density of metallic traces and variation of layer thickness across the surface. Accordingly, the first dummy metallic traces 414 with the first functional metallic traces 405 can increase surface flatness across the first routing layer 402. The first dummy metallic traces 414 are electrically isolated in the first, second, and third parts 414a, 414b, and 414c and are not connected to any of the first functional metallic traces 405, the vias (not shown), or to electronic components (not shown) on or in the routing layers 400 that form the ceramic substrate 401.

The second routing layer 403 also includes second dummy metallic traces 415 that are routed on the second routing layer 403 outside the areas of the second functional metallic traces 407. The second dummy metallic traces 415 can be routed in areas that do not include the second functional metallic traces 407 or that are sparsely routed with metallic traces or populated with other structures in comparison to areas with higher material density on the surface of the second routing layer 403. For example, the second dummy metallic traces 415 can include a first part 415a, a second part 415b, and a third part 415c of the second dummy metallic traces 415 that are routed outside the second functional metallic traces 407. The first, second, and third parts 415a, 415b, and 415c may be separate parts of the second dummy metallic traces 415 that are routed in three respective separate areas on the surface of the second routing layer 403. The second dummy metallic traces 415 in the first parts 415a, second part 415b, and third part 415c may have the same pattern. For example, similar to the patterns of the first dummy metallic traces 414 in the first routing layer 402, the pattern of the second dummy metallic traces 415 in the second routing layer 403 may be cross-hatched traces, line traces, or metallic patches in each of the first, second, and third parts 415a, 415b, and 415c. In other examples, the second dummy metallic traces 415 in the first, second, and third parts 415a, 415b, and 415c may have different patterns. The second dummy metallic traces 415 in the second routing layer 403 may also have different patterns than the first dummy metallic traces 414 in the first routing layer 402. In other examples, the second dummy metallic traces 415 may be distributed in fewer or more than three parts on the surface of the second routing layer 403.

The second dummy metallic traces 415 are provided, with the second functional metallic traces 407, on the surface of the second routing layer 403 to provide a more uniform density and distribution of the metallic surfaces or of materials on the surface, increase the density of metallic traces, and/or reduce gaps across the surface of the second routing layer 403. The second dummy metallic traces 415 are equally spaced in the respective areas of the first, second, and third parts 415a, 415b, and 415c. The second dummy metallic traces 415 can also have equal line width. The height (thickness) of the second dummy metallic traces 415 is also equal to the height of the second functional metallic traces 407 on the surface of the second routing layer 403. The line width and spacing of the second dummy metallic traces 415 may be equal or different in the different areas. Accordingly, the second dummy metallic traces 415 with the second functional metallic traces 407 can reduce surface variations on the second routing layer 403. The second dummy metallic traces 415 are electrically isolated in the first, second, and third parts 415a, 415b, and 415c and are not connected to any of the second functional metallic traces 407, the vias 410, or to electronic components (not shown) on or in the routing layers 400 of the ceramic substrate 401. The second dummy metallic traces 415 are also not connected to any other metallic traces or electronic components in other routing layers of the ceramic substrate 401.

The densities of the second dummy metallic traces 415 in the first, second, and third parts 415a, 415b, and 415c can also match the densities of the second functional metallic traces 407 around the respective areas. In other examples, the average densities of the second functional metallic traces 405 and the first dummy metallic traces 414 can be equal across the entire surface of the second routing layer 403, including the areas of the first, second, and third parts 415a, 415b, and 415c.

The routing layers 400 of the ceramic substrate 401 may also include any number of routing layers that include dummy metallic traces (not shown). The third routing layer 404 and any dummy routing layers within the ceramic substrate 401, as the routing design requires, can be configured similar to the same design features for the first and second routing layers 402 and 403.

The third routing layer 404 includes third dummy metallic traces 416. The third dummy metallic traces 416 are provided, with the third functional metallic traces 409, on the third routing layer 404 to provide a more uniform density and distribution of the metallic traces or of materials on the surface, increase the density of metallic traces, and/or reduce gaps across the third routing layer 404. Accordingly, the third dummy metallic traces 416 with the third functional metallic traces 409 can increase the surface flatness across the third routing layer 404. The line width and spacing of the third dummy metallic traces 416 may be equal or different in the different areas. The third dummy metallic traces 416 are equally spaced in the respective areas of the first, second, and third parts 416*a,* 416*b,* and 416*c*. The third dummy metallic traces 416 can also have equal line width. The height (thickness) of the third dummy metallic traces 416 is also equal to the height of the third functional metallic traces 409 on the surface of the third routing layer 404. The third dummy metallic traces 416 can be electrically isolated in multiple parts, such as first, second, and third parts 416*a,* 416*b,* and 416*c*, and are not connected to any of the third functional metallic traces 409, the vias 410, or to electronic components (not shown) on or in the routing layers 400. The third dummy metallic traces 416 are also not connected to any other metallic traces or electronic components in other routing layers of the stack of routing layers 400 in the ceramic substrate 401.

Each of the first, second, and third routing layers 402, 403, and 404, and similarly any other layers of the routing layers 400, can be formed by forming metallic traces on a ceramic sheet. For example, the metallic traces can be formed by a metal patterning process including metal deposition, such as for PCBs, or by a screen printing process with a conductive material paste. The first, second, and third routing layers 402, 403, and 404 are stacked on top of each other to form the ceramic substrate 401, as shown on the right side of FIG. 4. The first, second, and third routing layers 402, 403, 404 and any other layers of the routing layers 400 are aligned, stacked and mechanically pressed together. This causes the routing layers 400 to adhere to each other and form the ceramic substrate 401 as a homogeneous structure. In other examples, the routing layers 400 can be stacked and laminated to form the ceramic substrate 401.

For example, as shown in the cross sectional view of FIG. 4B, the metallic traces on a surface of a routing layer 400 may be covered by another routing layer 400 that is stacked on top of the metallic traces. For example, the third routing layer 404 that is stacked on top of the second routing layer 403 covers the second functional metallic traces 407 and the second dummy metallic traces 415 on the surface of the second routing layer 403, including the first, second and third parts 415*a,* 415*b,* and 415*c*. Similarly, the second routing layer 403 that is stacked on top of the first routing layer 402 covers the first functional metallic traces 405 and the first dummy metallic traces 414 on the surface of the first routing layer 402, including the first, second and third parts 414*b,* 414*b,* and 414*c*. In other examples, the routing layers 400 can be laminated and bonded by epoxy layers that are placed between the routing layers 400. For example, a respective epoxy layer that bonds the second routing layer 403 to the first routing layer 402 covers the first functional metallic traces 405 and the first dummy metallic traces 414 on the surface of the first routing layer 402. Similarly, a respective epoxy layer that bonds the third routing layer 404 to the second routing layer 403 covers the second functional metallic traces 407 and the second dummy metallic traces 415 on the surface of the second routing layer 403. The first, second, and third routing layers 402, 403, and 404 are layers of a ceramic material 408.

The first, second, and third routing layers 402, 403, and 404 are also aligned to extend the vias 410 through the first, second, and third layers 402, 403, and 404. The vias 410 may be electrically coupled to the first, second, and third functional metallic traces 405, 407, and 409 and filled or plated with the same conductive material. For example, the vias 410 may provide either power, grounding, or discrete signals to the first, second, and third functional metallic traces 405, 407, and 409.

Increasing surface flatness across the first, second, and third routing layers 402, 403, and 404 with the first, second, and third dummy metallic traces 414, 415, and 416, respectively, also reduces layer thickness variation and increases surface flatness throughout and across the stack of routing layers 400 within the ceramic substrate 401. This reduces stresses due to the non-uniform thickness of epoxy that attaches a die 420 to the ceramic substrate 401 in the area where the die may be attached, also referred to herein as a die attach area. The die attach area is a location of the surface upon which the die 420 is attached to one of the routing layers 400. For example, the die 420 can be a SLM die such as a DMD chip attached to the ceramic substrate 401 on the surface of the third routing layer 404, as shown in the cross sectional view of FIG. 4. In this case, the stress is reduced in the attached component and the bond lines which attach that component. Reducing the stress induced across the die attach area also reduces the stress on the backside area of the ceramic substrate 401, where a land grid array (LGA) can be provided for electrical contacts. In this case, the electrical interface contact distance of the LGA is also reduced, which increases the reliability of the signal connection through the LGA.

Figure 5:
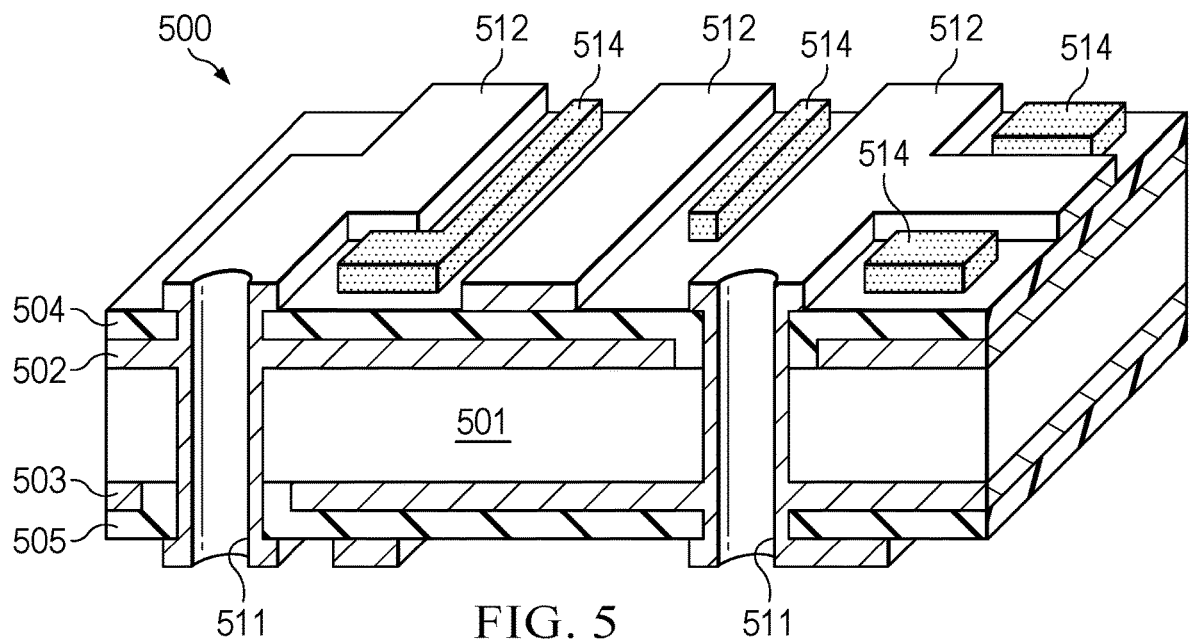
FIG. 5 is a diagram showing routing layers in a printed circuit board (PCB) with dummy metallic traces, in accordance with various examples.

FIG. 5 shows a PCB 500 including multiple layers of dielectric and conductive materials. The PCB 500 includes a substrate 501 positioned between a first conductive layer 502 and a second conductive layer 503 on opposite sides of the substrate 501. For example, the first conductive layer 502 and second conductive layer 503 can be copper layers that can carry current and which are separated by the substrate 501. The substrate 501 can be composed of woven glass and epoxy and is an electrically isolating layer between the first conductive layer 502 and the second conductive layer 503. The PCB 500 also includes a first routing layer 504 on a surface of the first conductive layer 502 opposite to the substrate 501, and a second routing layer 505 on a surface of the second conductive layer 503 opposite to the substrate 501. The first routing layer 504 and similarly the second routing layer 505 can be dielectric layers that include on their respective surfaces metallic traces that form one or more circuits in the PCB 500.

The PCB 500 also includes vias 511 that extend through the layers of the PCB 500 and can connect one or more circuits on opposite sides of the PCB 500. The first routing layer 504 includes functional metallic traces 512 and dummy metallic traces 514. As shown in FIG. 5, the functional metallic traces 512 and the dummy metallic traces 514 are routed in respective separate areas on the surface of the first routing layer 504. The functional metallic traces 512 are configured to carry current in one or more circuits on both sides of the PCB 500. In examples, the dummy metallic traces 514 are routed on the first routing layer 504 outside the areas of the functional metallic traces 512. The dummy metallic traces 514 can also be routed in areas that are sparsely routed with functional metallic traces 512. The dummy metallic traces 514 routed in the different areas may have the same pattern or may have different patterns. The second routing layer 505 can also include, on the surface, functional metallic traces and dummy metallic traces (not shown). The functional metallic traces 512 on the surface of the first routing layer 504 and the functional metallic traces (not shown) on the second routing layer 505 can be connected to the vias 511, which may provide either power, grounding, or discrete signals to the electrical circuits in the PCB 500. The PCB 500 in FIG. 5 is a dual side PCB that have one or more circuits on both sides. In other examples, PCBs can have one or more circuits in one or more routing layers that are stacked on one side of the PCB substrate. The one or more routing layers can include functional and dummy metallic traces configured similar to the functional and dummy metallic traces 512 and 514, respectively.

The pattern of the dummy metallic traces 514 can be similar to or different from the pattern of the functional metallic traces 512. For example, the functional metallic traces 512 can be patterned as lines of metallic traces, and the dummy metallic traces 514 can be patterned similarly as line traces or can be cross-hatched traces, line traces, or metallic patches.

The dummy metallic traces 514 are provided, with the functional metallic traces 512, on the surface of the first routing layer 504 to provide a more uniform density and distribution of the metallic traces or of materials on the surface, increase the density of metallic traces, and/or reduce gaps across the surface of the first routing layer 504. To provide this uniform density of metallic traces, the dummy metallic traces 514 are equally spaced in each of the respective areas. The dummy metallic traces 514 can also have equal line width. The height (thickness) of the dummy metallic traces 514 is also equal to the height of the functional metallic traces 512 on the surface of the first routing layer 504. The line spacing of the dummy metallic traces 514 may be equal or different in the different areas.

The densities of the dummy metallic traces 514 may match the densities of the functional metallic traces 512. Accordingly, if the density of the functional metallic traces 512 are different in respective areas on the first routing layer 504, the densities of the dummy metallic traces 514 are also different around the respective areas. For example, if the functional metallic traces 512 have a higher metallic density in a first area on the surface than in a second area on the surface, the density of the dummy metallic traces 514 around the first area is also higher than the density of the dummy metallic traces 514 around the second area.

In other examples, the average densities of the functional metallic traces 512 and the dummy metallic traces 514 can be equal across the entire surface of the first routing layer 504. In this case, the densities of the dummy metallic traces 514 in separate areas may be determined according to the respective densities of the functional metallic traces 512 around the respective separate areas to provide an average density of metallic traces across the entire surface of the first routing layer 504 and.

Figure 6:
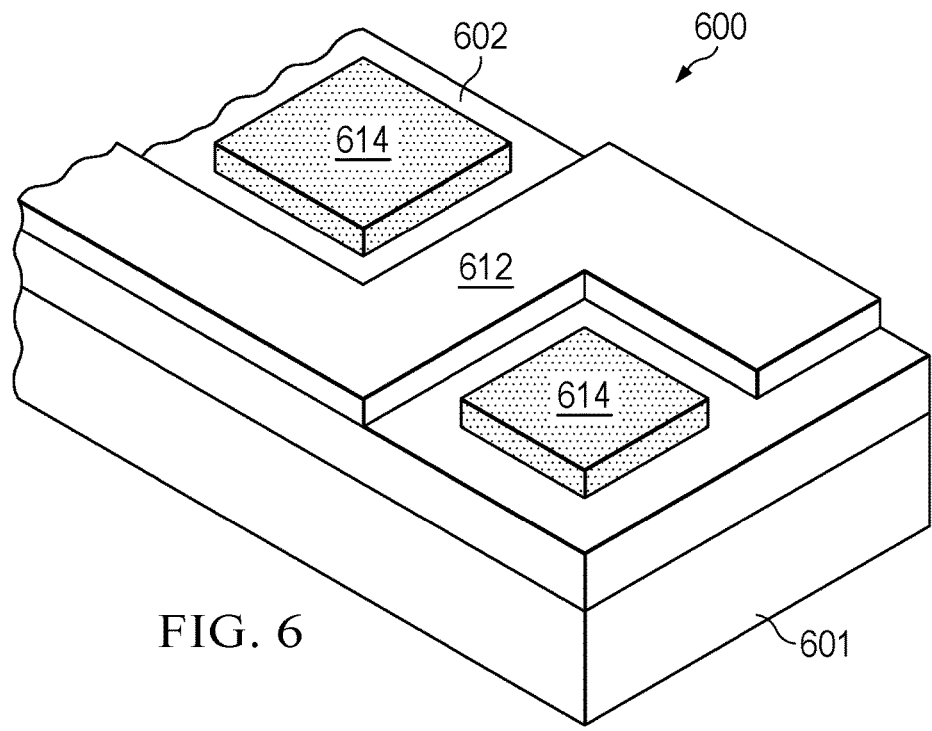
FIG. 6 is a diagram showing a routing layer in a silicon-based circuit board (SiCB) with dummy metallic traces, in accordance with various examples.

FIG. 6 is a diagram showing a routing layer in a silicon-based circuit board (SiCB) with dummy metallic traces, in accordance with various examples. FIG. 6 shows a SiCB 600 including a silicon substrate 601 and a routing layer 602 on the silicon substrate 601. The routing layer 602 can be a dielectric layer that includes functional metallic traces 612 that form one or more circuits in the SiCB 600. The routing layer 602 also includes dummy metallic traces 614 that are routed on the surface around the functional metallic traces 612. The dummy metallic traces 614 can be routed in areas that are not routed by functional metallic traces 612 or sparsely routed with functional metallic traces 612. In other examples, SiCBs can have multiple routing layers stacked on top of each other on the silicon substrate. The routing layers can include functional and dummy metallic traces configured similar to the functional and dummy metallic traces 612 and 614, respectively.

The dummy metallic traces 614 may have the same pattern or may have different patterns on different areas of the surface of the routing layer 602. The pattern of the dummy metallic traces 614 can be similar to or different from the pattern of the functional metallic traces 612. For example, the functional metallic traces 612 can be line traces, and the dummy metallic traces 614 can also be line traces, can be cross-hatched traces, line traces, or metallic patches.

The dummy metallic traces 614 are provided, with the functional metallic traces 612, on the surface of the routing layer 602 to provide a more uniform density and distribution of the metallic traces or of materials on the surface, increase the density of metallic traces, and/or reduce gaps across the surface of the routing layer 602. To provide this uniform density of metallic traces, the dummy metallic traces 614 are equally spaced in each of the respective areas. The dummy metallic traces 614 can also have equal line width. The height (thickness) of the dummy metallic traces 614 is also similar to the height of the functional metallic traces 612 on the surface of the routing layer 602. The line width and spacing of the dummy metallic traces 614 may be equal or different in the different areas.

The densities of the dummy metallic traces 614 in the SiCB 600 may match the densities of the functional metallic traces 612. The densities of the dummy metallic traces 614 may be different in different areas on the surface depending on the density of the functional metallic traces 612 around the respective areas. In other examples, the average densities of the functional metallic traces 612 and the dummy metallic traces 614 can be equal across the entire surface of the routing layer 602.

Figure 7:
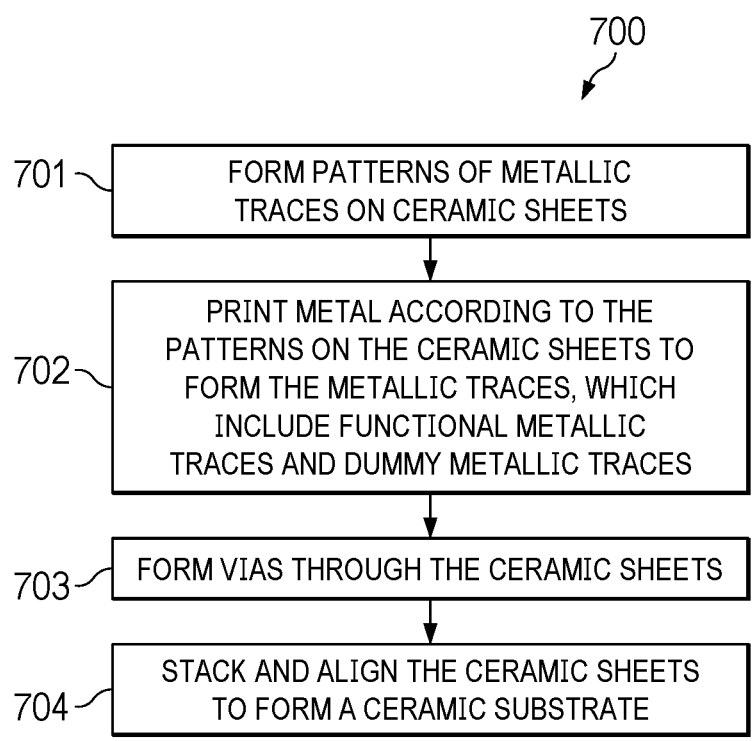
FIG. 7 is a flow diagram of a method for forming planar surfaces in one or more routing layers of an integrated circuit, in accordance with various examples.

FIG. 7 is a flow diagram of a method 700 for forming planar surfaces in one or more routing layers of an integrated circuit of an electronic device, in accordance with various examples. For example, the method 700 can be useful for producing planar surfaces in routing layers of a ceramic substrate that includes metallic traces, such as the routing layers 400 of the ceramic substrate 401. The routing layers are ceramic sheets that can be produced, such as by a tape casting process, as a mixture of ceramic and binder materials.

At step 701, patterns of metallic traces are formed on ceramic sheets. The pattern for each ceramic sheet determines the routing of functional metallic traces and dummy metallic traces on the surface of the ceramic sheet. For example, a resist layer is deposited on the surface of the ceramic sheet and patterned, such as by a photolithography process. The resist layer is a mask layer to determine the pattern of the metallic traces. In other examples, a screen can be patterned according to circuit design. The screen is a mask for screen printing the metallic traces on the surface. According to the pattern, the dummy metallic traces are separated from the functional metallic traces. The patterning of the dummy metallic traces can be determined to provide a density of the dummy metallic traces, such as within at least 50% of the density of the functional metallic traces. In this case, the density of the dummy metallic traces is at least half of the density of the functional metallic traces on the surface. In other examples, the density of the dummy metallic traces can be 75% or any percentage between 50% and 100% of the density of the functional metallic traces. In the case of a 100% match up, the functional and dummy metallic traces have equal metallic density. The metal lines of the functional and dummy metallic traces can have approximately the same width and spacing and accordingly the same metallic density by the same fabrication process. In the pattern, the dummy metallic traces can have equal line width and spacing, which determines the ratio of the metal filled portion of dummy metallic traces to the gap portion in the spacing between the metallic traces. For example, the dummy metallic traces are comprised of line traces or cross-hatched traces composed of metal lines of approximately the same width and spacing that are formed by the same fabrication process. This ratio represents the density of the dummy metallic traces. In examples, the density of the dummy metallic traces can be determined to provide an average density of metallic traces across the surface of the ceramic sheet. In this case, the density of the dummy metallic traces can vary based on the density of the functional metallic traces in different areas on the surface.

At step 702, metal is printed according to the patterns on the ceramic sheets to form the metallic traces, which include functional metallic traces and dummy metallic traces. For example, the metal can be deposited over a patterned resist layer on the surface. The resist layer is then removed to provide the patterned metal layer. In other examples, metal can be screen printed through a patterned screen to transfer and pattern a metal layer on the surface of the ceramic sheets. According to the patterns, the printed dummy metallic traces are electrically isolated from the functional metallic traces on the surface and may not be electrically coupled to carry current in the circuit. In another example, a resist layer is deposited on top of a metal layers on the surface of the ceramic sheet. The resist layer is then patterned, the exposed metal is etched and the remaining resist is removed to form the metallic traces on the surface.

At step 703, vias are formed through the ceramic sheets. For example, the vias can be formed by punching holes into the ceramic sheets. The vias will be electrically coupled to the functional metallic traces and may be electrically isolated from the dummy metallic traces. The vias in the ceramic sheets can be filled or plated with the same conductive material as the metallic traces to provide electrical interconnections between one or more ceramic sheets. The vias are electrically coupled to the functional metallic traces and may be separated and electrically isolated from the dummy metallic traces. The vias in the ceramic sheets can be filled or plated with the same conductive material as the metallic traces to provide electrical interconnections between one or more ceramic sheets.

At step 704, the ceramic sheets are stacked and aligned to form a ceramic substrate. For example, the routing layers 400 are stacked, aligned and mechanically pressed or laminated to form the ceramic substrate 401. In other examples, the ceramic sheets can be stacked and then the vias can be punched into the stack of ceramic sheets.

The method 700 can also be useful for forming planar surfaces in PCBs or SiCBs with one or more routing layers, such as the PCB 500 or SiCB 600. The routing layers can be dielectric layers that are stacked on a substrate, such as a PCB or SiCB substrate. The patterns of the metallic traces can be formed and the metal can be printed to route the metallic traces on the dielectric layers. Multiple dielectric layers can be stacked on top of each other and processed on a PCB or SiCB substrate. The stack of layers on the substrate can also include layers other than the routing layers, such as uniform metal layers between the dielectric layers.

In the method 700, the density of metallic traces is increased per routing layer by adding the dummy metallic traces to provide a more uniform distribution of the metallic traces or of materials across the surface. Routing the dummy metallic traces also reduces gaps across the surface of the routing layer. Accordingly, the variation of layer thickness across the surface is also reduced. Increasing the surface flatness of routing layers can reduce stress in the attached die and associated bond lines and increase process yield at assembly. This can include reducing wafer level packaging (WLP) delamination, increasing the accuracy of die placement, and producing more uniform die attach epoxy. Increasing the surface flatness of routing layers and reducing stress in the attached die and associated bond lines can also be useful for producing circuit designs and devices that are sensitive to stress during assembly or subsequent mechanical or environmental testing and deployment.

The term "couple" appears throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A system or device that is described herein as including certain components may instead be adapted to be coupled to those components to form the described system or device.

While certain components may be described herein as being of a particular process technology, these components may be exchanged for components of other process technologies. Systems and devices described herein are reconfigurable to include the replaced components to provide functionality at least partially similar to functionality available prior to the component replacement.

Unless otherwise stated, "about," "approximately," or "substantially" preceding a value means +/−10 percent of the stated value. Modifications are possible in the described examples, and other examples are possible within the scope of the claims.

What is claimed is:

1. An electronic device, comprising:
   a substrate having a surface;
   functional metallic traces on a first portion of the surface, the functional metallic traces electrically connected to carry current in the electronic device;
   first dummy metallic traces on a second portion of the surface, the first dummy metallic traces electrically isolated from the functional metallic traces, wherein the first dummy metallic traces have a first density; and
   second dummy metallic traces on a third portion of the surface, the second dummy metallic traces electrically isolated from the functional metallic traces, wherein the second dummy metallic traces have a second density, the second density different than the first density.

2. The electronic device of claim 1, wherein the first dummy metallic traces include line traces of equal line width and spacing in the second portion, and wherein the line width and spacing determine the first density of the first dummy metallic traces in the second portion.

3. The electronic device of claim 1, wherein the second portion of the surface of the substrate includes one or more gaps that are filled with the first dummy metallic traces in the second portion of the surface.

4. The electronic device of claim 1, wherein the functional metallic traces and the first dummy metallic traces comprise a same conductive material.

5. The electronic device of claim 1, further comprising a die attached to the substrate, wherein the die is electrically connected to the functional metallic traces and is electrically isolated from the first dummy metallic traces.

6. The electronic device of claim 1, wherein the first dummy metallic traces are cross-hatched traces.

7. The electronic device of claim 1, wherein the substrate is a first substrate, wherein the surface is a first surface of the first substrate, wherein the functional metallic traces are first functional metallic traces, and wherein the electronic device further comprises:
    a second substrate over the first substrate, the first functional metallic traces, the first dummy metallic traces, and the second dummy metallic traces, the second substrate having a second surface;
    second functional metallic traces on a fourth portion of the second surface of the second substrate, the second functional metallic traces electrically connected to carry current in the electronic device; and
    third dummy metallic traces on a fifth portion of the second surface of the second substrate, the third dummy metallic traces electrically isolated from the second functional metallic traces.

8. The electronic device of claim 7, wherein the first dummy metallic traces and the third dummy metallic traces have a same pattern.

9. The electronic device of claim 1, wherein the substrate is a ceramic substrate.

10. The electronic device of claim 1, wherein the substrate is a printed circuit board (PCB) substrate or a silicon substrate.

11. The electronic device of claim 1, wherein the functional metallic traces are first functional metallic traces having a third density, the first density of the first dummy metallic traces based on the third density of the first functional metallic traces, the electronic device further comprising second functional metallic traces having a fourth density, the second density of the second dummy metallic traces based on the fourth density of the second functional metallic traces.

12. The electronic device of claim 11, there the first functional metallic traces are at least partially around the first dummy metallic traces and the second functional metallic traces are at least partially around the second dummy metallic traces.

13. A device, comprising:
    a ceramic substrate comprising:
        a first layer having a first surface, the first layer comprising:
            first functional metallic traces on a first portion of the first surface of the first layer of the ceramic substrate, wherein the first functional metallic traces have a first density;
            first dummy metallic traces on a second portion of the first surface of the first layer of the ceramic substrate, the first dummy metallic traces electrically isolated from the first functional metallic traces, wherein the first dummy metallic traces have a second density;
        a second layer on the first layer, the second layer having a second surface the second layer comprising:
            second functional metallic traces on a third portion of the second surface of the second layer of the ceramic substrate, wherein the second functional metallic traces have a third density; and
            second dummy metallic traces on a fourth portion of the second surface of the second layer of the ceramic substrate, the second dummy metallic traces electrically isolated from the second functional metallic traces, wherein the second dummy metallic traces have a fourth density; and
    a die attached to the second layer of the ceramic substrate, the die electrically connected to the first functional metallic traces and to the second functional metallic traces, and the die electrically isolated from the first dummy metallic traces and the second dummy metallic traces.

14. The device of claim 13, wherein the first functional metallic traces are line traces, and wherein the first dummy metallic traces are cross-hatched traces.

15. The device of claim 13, wherein the die is a spatial light modulator (SLM) die.

16. The device of claim 13, wherein the fourth density of the second dummy metallic traces is different than the second density of the first dummy metallic traces.

17. An apparatus comprising:
    a printed circuit board (PCB) having a first surface and a second surface opposite the first surface;
    first functional metallic traces on the first surface of the PCB, wherein the first functional metallic traces have a first density;
    first dummy metallic traces on the first surface of the first surface of the PCB, the first dummy metallic traces electrically isolated from the first functional metallic traces, wherein the first dummy metallic traces have a second density;
    second functional metallic traces on the second surface of the PCB, wherein the second functional metallic traces have a third density; and
    second dummy metallic traces on the second surface of the PCB, wherein the second dummy metallic traces have a fourth density, the second dummy metallic traces electrically isolated from the second functional metallic traces.

18. The apparatus of claim 17, wherein the second density of the first dummy metallic traces is different than the fourth density of the second dummy metallic traces.

19. The apparatus of claim 17, wherein the second density of the first dummy metallic traces is based on the first density of the first functional metallic traces and the third density of the second dummy metallic traces is based on the third density of the second functional metallic traces.

20. The apparatus of claim 17, wherein the first dummy metallic traces has a first pattern, the second dummy metallic traces has a second pattern, the second pattern different than the first pattern.

* * * * *